(12) United States Patent
Tolpygo

(10) Patent No.: US 7,615,385 B2
(45) Date of Patent: Nov. 10, 2009

(54) DOUBLE-MASKING TECHNIQUE FOR INCREASING FABRICATION YIELD IN SUPERCONDUCTING ELECTRONICS

(75) Inventor: Sergey K. Tolpygo, Putnam Valley, NY (US)

(73) Assignee: Hypres, Inc, Elmsford, NY (US)

( * ) Notice: Subject to any disclaimer, the term of this patent is extended or adjusted under 35 U.S.C. 154(b) by 170 days.

(21) Appl. No.: 11/616,382

(22) Filed: Dec. 27, 2006

(65) Prior Publication Data

US 2008/0070325 A1    Mar. 20, 2008

Related U.S. Application Data

(60) Provisional application No. 60/826,262, filed on Sep. 20, 2006.

(51) Int. Cl.
*H01L 21/00* (2006.01)
(52) U.S. Cl. .......................................................... 438/2
(58) Field of Classification Search ............... 438/2; 257/661–663, E39.002–39.003, E23.076
See application file for complete search history.

(56) References Cited

U.S. PATENT DOCUMENTS

| | | | |
|---|---|---|---|
| 4,364,167 A * | 12/1982 | Donley | 438/130 |
| 4,499,119 A * | 2/1985 | Smith | 427/63 |
| 4,589,961 A | 5/1986 | Gershenson | |
| 6,238,582 B1 * | 5/2001 | Williams et al. | 216/22 |
| 6,830,950 B2 * | 12/2004 | Chinn et al. | 438/52 |
| 7,060,508 B2 | 6/2006 | Kerber | 438/2 |
| 7,105,583 B2 | 9/2006 | Hu | 522/90 |
| 7,105,853 B2 | 9/2006 | Kerber | |

2004/0135139 A1 * 7/2004 Koval et al. ............... 257/31

OTHER PUBLICATIONS

Abelson, Lynn and Kerber, George, "Superconducting Integrated Circuit Fabrication Technology", IEEE, vol. 92, No. 10, Oct. 2004, pp. 1517-1533.

Meng, Xiaofan and Van Duzer, Theodore, "Light-Anodization Process for High-$J_c$ Micron and Submicron Superconducting Junction and Integrated Circuit Fabrication", IEEE Transactions on Applied Superconductivity, vol. 13, No. 2, Jun. 2003, pp. 91-94.

(Continued)

*Primary Examiner*—Ha Tran T Nguyen
*Assistant Examiner*—Shaun Campbell
(74) *Attorney, Agent, or Firm*—Hoffberg & Associates

(57) ABSTRACT

A new technique is presented for improving the microfabrication yield of Josephson junctions in superconducting integrated circuits. This is based on the use of a double-layer lithographic mask for partial anodization of the side-walls and base electrode of the junctions. The top layer of the mask is a resist material, and the bottom layer is a dielectric material chosen so as to a) maximize adhesion between the resist and the underlying superconducting layer, b) be etch-compatible with the underlying superconducting layer, and c) be insoluble in the resist and anodization processing chemistries. In a preferred embodiment of the invention, the superconductor is niobium, the material on top of this is silicon dioxide, and the top layer is conventional photoresist or electron-beam resist. The use of this combination results in a substantial increase in the fabrication yield of high-density superconducting integrated circuits due to increase in junction uniformity and reduction in defect density. An additional improvement over the prior art involves the replacement of a wet-etch step with a dry etch more compatible with microlithography.

19 Claims, 16 Drawing Sheets

OTHER PUBLICATIONS

Yohannes et al., "Characterization of HYPRES' 4.5 kA/ cm$^2$ & 8 kA/cm$^2$ Nb/AlO$_x$/Nb Fabrication Processes", IEEE Transactions on Applied Superconductivity, vol. 15, No. 2, Jun. 2005, pp. 90-93.

Smith, et al., Uniformity and Stability of Nb-aSi-Nb "SNAP" Josephson Tunnel Junctions, EEE Transactions on Magnetics, vol. MAG-19, No. 3, May 1983, pp. 787-790.

* cited by examiner

DOUBLE-MASKING TECHNIQUE FOR INCREASING FABRICATION YIELD IN SUPERCONDUCTING ELECTRONICS

CROSS REFERENCE TO RELATED APPLICATIONS

This application is related to and claims priority to Provisional Application 60/826,262 filed Sep. 20, 2006 by inventor Sergey K. Tolpygo entitled A Double-Masking Technique for Increasing Fabrication Yield and Josephson Junction Quality in Superconducting Electronics, the contents of which are incorporated herein by reference in its entirety.

This invention was developed in part under contract number N0014-03-C-0370 from the Office of Naval Research, Deborah Van Vechten, Contract Administrator.

BACKGROUND OF THE INVENTION

1. Field of the Invention

The invention is directed to fabrication of electronic devices and more particularly to the fabrication of superconducting electronic devices such as Josephson junctions.

2. Description of the Prior Art

Superconducting integrated circuits (ICs) based on Josephson junctions offer the possibility of operation at clock frequencies of 100 GHz or above. In order to achieve this on an industrial scale, it is necessary to decrease junction size toward submicron dimensions, and increase junction density, so that chips with many thousands of Josephson junctions can be reliably manufactured. The key parameter is the critical current $I_c$ of a junction, which must be defined to within about 1% of design specifications, without defects.

The most reliable junction fabrication technology is based on the superconductor niobium (Nb), and in particular on a trilayer structure based on an ultrathin insulating "tunnel barrier" layer of aluminum oxide ($AlO_x$), 1-2 nm thick, sandwiched between two layers of Nb. This provides a precise critical current density of the junction $J_c=I_c/A$, where A is the junction area. If the microlithography defines A accurately, without damaging the tunnel barrier layer, then $I_c$ is also accurately defined. This becomes increasingly difficult as the dimensions of the junction decrease. Applications of standard microlithography techniques may produce junctions with edge damage that can reduce junction quality and yield.

Current Nb IC technology also incorporates multiple layers of superconducting Nb wiring to bias and connect the Josephson junctions. This requires high-quality insulating layers between Nb layers, which are typically provided by silicon dioxide ($SiO_2$). $SiO_2$ is of course a standard material in semiconductor technology, and standard procedures for fabricating high-quality films are available.

An established technique in the prior art to improve junction yield is the use of selective anodization (Meng 2003, Kerber 2006). Anodization is an electrolytic process of surface oxidation that passivates all exposed Nb and Al surfaces, preventing damage in subsequent lithographic steps. However, this has not completely eliminated defects and related yield problems. It is essential to solve these problems to advance to the next stage of circuit integration.

PROBLEMS OF THE PRIOR ART

As indicated above, the techniques of the prior art have resulted in a number of problems. Specifically, the techniques of the prior art have resulted in low yield, that is, a large number of junctions fabricated on a silicon based wafer fail for a variety of reasons. This results in a substantial percentage of defective junctions on each wafer.

Sometimes part of a junction will simply peel off the wafer upon which it is fabricated, due in part to local stresses that result from the anodization procedure. Further, the prior art does not allow precise control of critical current densities of a junction. Yet another problem stems from the fact that the standard process includes a wet-etching step to remove the anodized AlOx layer, which also limits device yield.

BRIEF SUMMARY OF THE INVENTION

Maintaining ideal adhesion between layers is essential for microlithographic control, and is especially critical during the selective anodization step of junction definition. During this step, penetration of the anodization solution (the electrolyte) under the resist would cause major fabrication defects. Standard resists have been optimized for the semiconductor industry, where the most critical materials are Si and $SiO_2$, and adhesion of resists to these materials is outstanding. In contrast, no such optimization exists for Nb, the key material for superconducting circuits. In the present invention (see FIG. 2), a thin layer of $SiO_2$ is used as an adhesion layer in a double-layer mask for defining the area of Josephson junctions. The $SiO_2$ adheres well to Nb (since it has also been optimized for an insulation layer), and also adheres very well to the top resist layer. Furthermore, $SiO_2$ is inert with respect to both aqueous and organic solvents used in anodization processing and resist processing (for both positive and negative resists), but can also be removed where necessary by standard etching techniques.

The invention recognizes that failure of interlayer adhesion between photoresist and Nb is a major cause of defects in the fabrication technology of the prior art. By substantially improving such adhesion, the present invention offers the possibility of improved reliability and IC yield.

In the prior art, the very same photoresist mask had to survive two subsequent fabrication steps—etching and self-aligned junction anodization (passivation) without loss of adhesion. The new technique is more robust in this respect since the bottom layer of the double-layer would prevent defect formation during anodization even if the top (resist) layer fails. This technique has been incorporated into a complete IC process, and indeed has resulted in substantially improved IC yield, especially for the smallest junctions (below 1.5 microns size) where the problems had previously been the most severe.

The present invention does increase the number of steps in the full process, since the SiO2 layer in the mask must first be deposited, and subsequently etched away. (However, this etch-away step can be done simultaneously with the counter-electrode etching.) Nevertheless, this extra effort is easily worthwhile, since it enables the manufacturing (with reasonable yield) of higher-density superconducting ICs with greatly enhanced device speed and performance.

A second process improvement of the present invention replaces a wet-etch process for AlOx removal in the prior art with an optimized dry-etch (or argon ion mill) process, in order to enhance junction uniformity and yield for small junctions.

A detailed description of a preferred embodiment of the invention, including a step-by-step process with fabrication parameters, is shown below.

DETAILED DESCRIPTION OF THE INVENTION

A new fabrication method is proposed for increasing the yield and quality of superconducting junctions and more particularly Josephson junctions and Josephson-based digital and analog circuits in superconducting electronics. The method is based on using a double-layer mask for partial anodization of the junction side-walls and base-electrode around the junction. The top layer of this mask is a photoresist or electron-beam resist, and the bottom layer is a dielectric (e.g., SiO$_2$) that is insoluble in either aqueous or organic solvents. A more detailed description will now be given.

Figure 1:
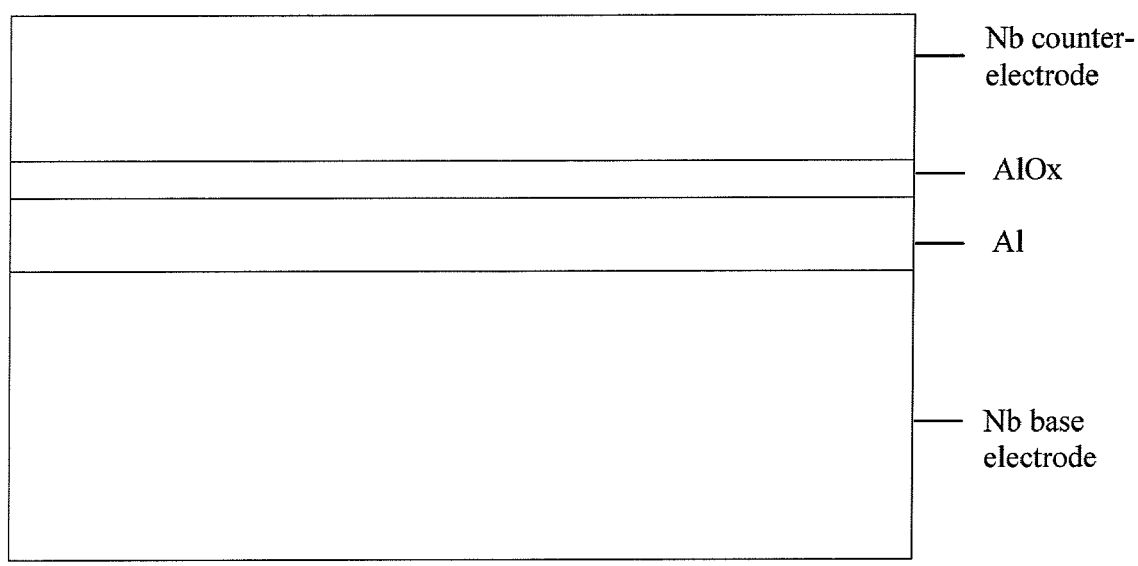
FIG. 1 shows a cross section of a wafer having Nb/Al/AlO$_x$/Nb layers as used in the fabrication of superconducting devices such as a Josephson junction.

The existing fabrication scheme for making Nb-based Josephson tunnel junctions for superconducting electronics is comprised of the following fabrication steps:

1. As shown in FIG. 1, a Nb/Al/AlO$_x$/Nb trilayer is deposited in-situ on a wafer that includes or will include several other patterned layers of metal and dielectric. A tunnel barrier is formed by in-situ thermal oxidation of the Al layer in oxygen or an oxygen/argon mixture at a defined pressure, to form a thin (~1-2 nm) layer of AlO$_x$. Both the oxidation time and the pressure determine the properties of the tunnel barrier such as the Josephson critical current density J$_c$. The bottom Nb layer is called the base electrode, and the top Nb layer is called the counter-electrode of the tunnel Josephson junctions.

Figure 2:
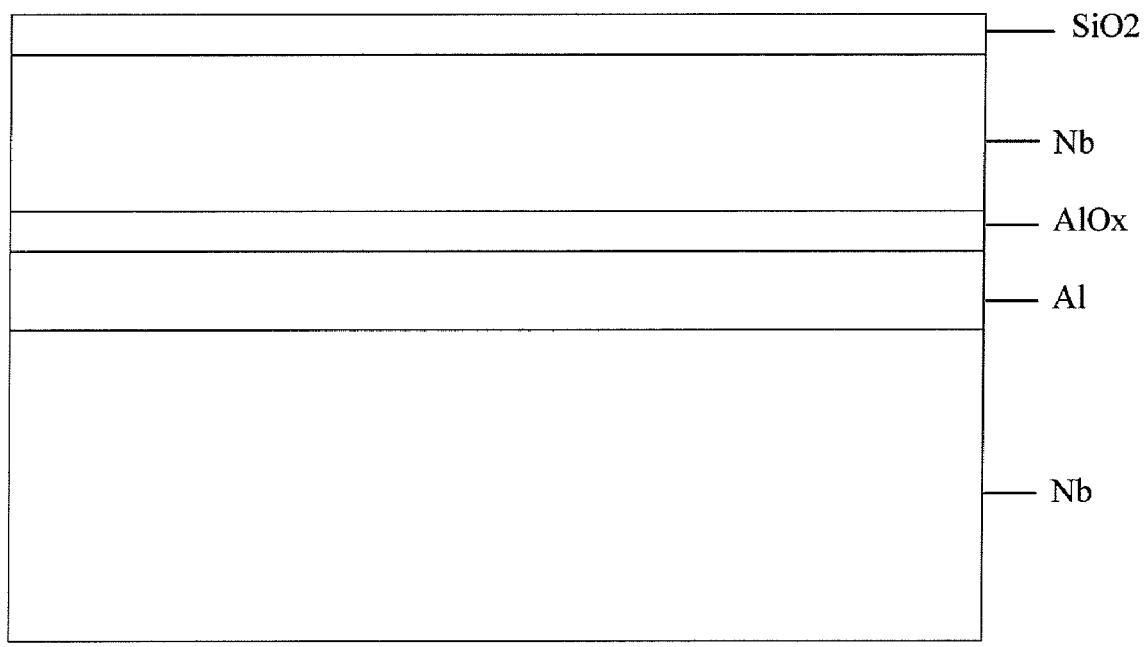
FIG. 2 shows a modification of the prior art process whereby dielectric layer of SiO$_2$ is deposited to act as an adhesion layer between the Nb and the photoresist layer deposited during the next process step.

2. FIG. 2 shows a step that differs from prior art fabrication techniques and will be discussed in more detail hereinafter.

Figure 3:
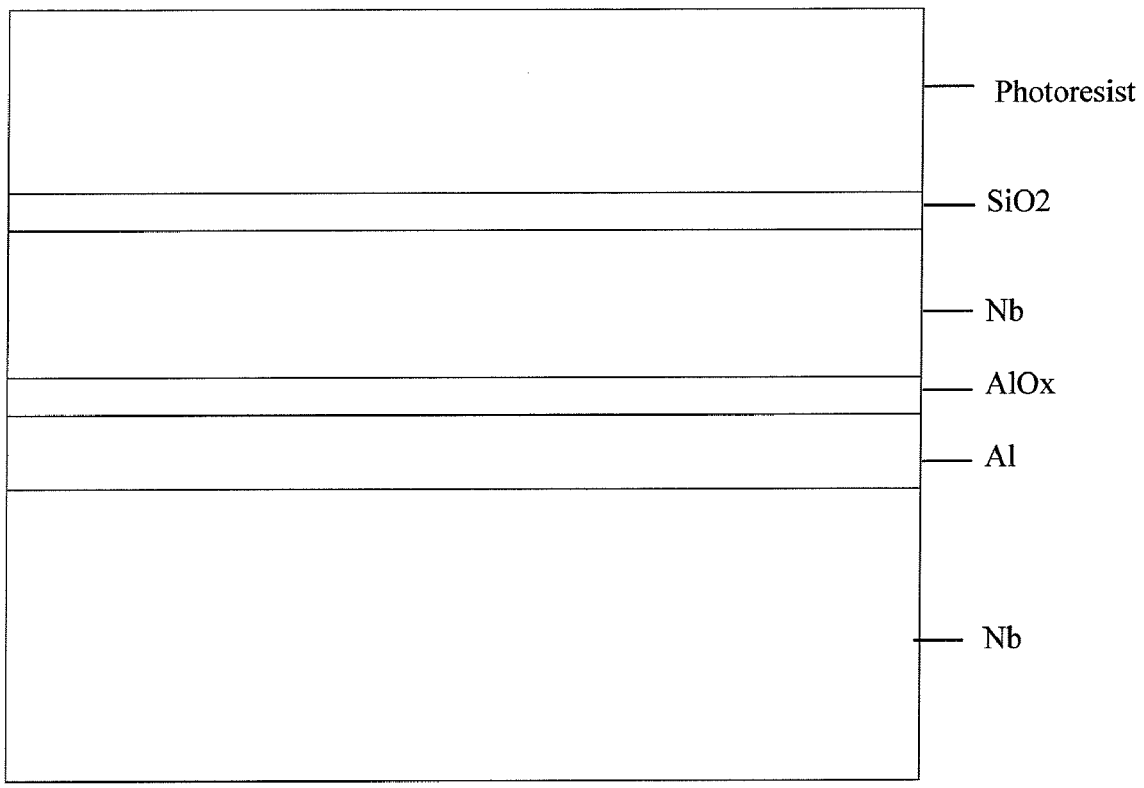
FIG. 3 shows application of a photoresist layer on top of the silicon dioxide layer in accordance with one aspect of the invention.
Figure 4:
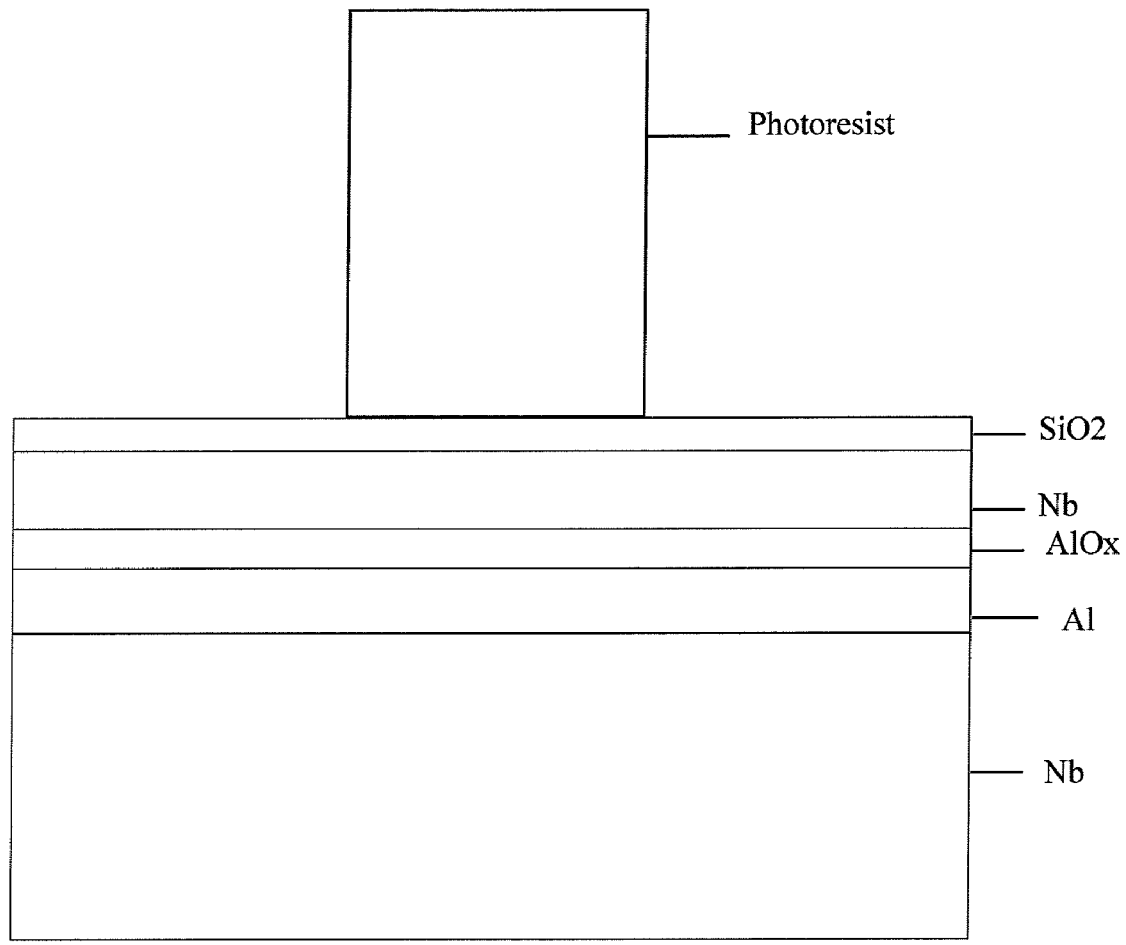
FIG. 4 shows the photoresist area that defines the junction area after exposure and development of the photoresist.
Figure 5:
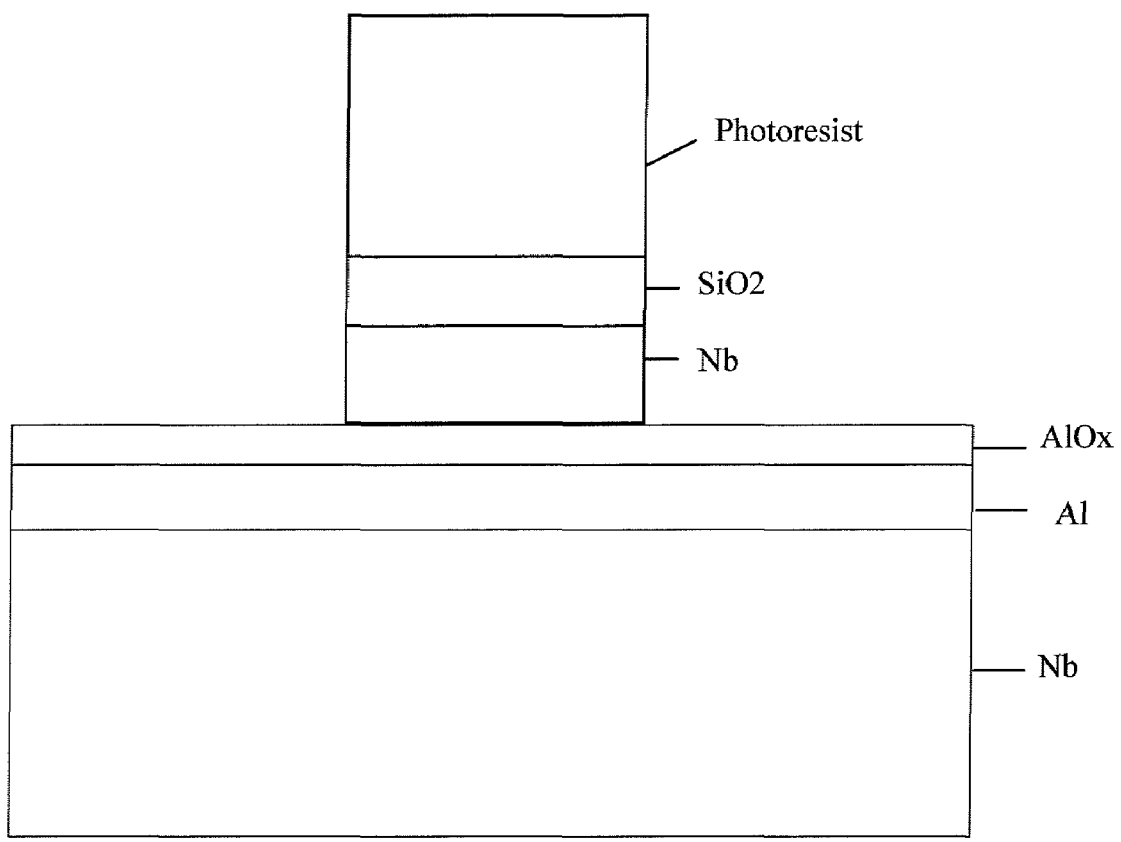
FIG. 5 shows the etching of the SiO$_2$ adhesion layer and Nb counter-electrode down to the AlO$_x$/Al barrier layer.

3. The wafer is coated with either positive or negative resist (FIG. 3), and the resist etch mask is formed by optical or e-beam lithography (FIG. 4). The counter-electrode area is then defined by etching (FIG. 5), using e.g. plasma etching, reactive-ion etching, or high-density plasma etching. The AlO$_x$/Al layer acts as an etch stop. (Note—the prior art method does not include the thin SiO$_2$ layer shown in FIGS. 3, 4 and 5.)

Figure 6A:
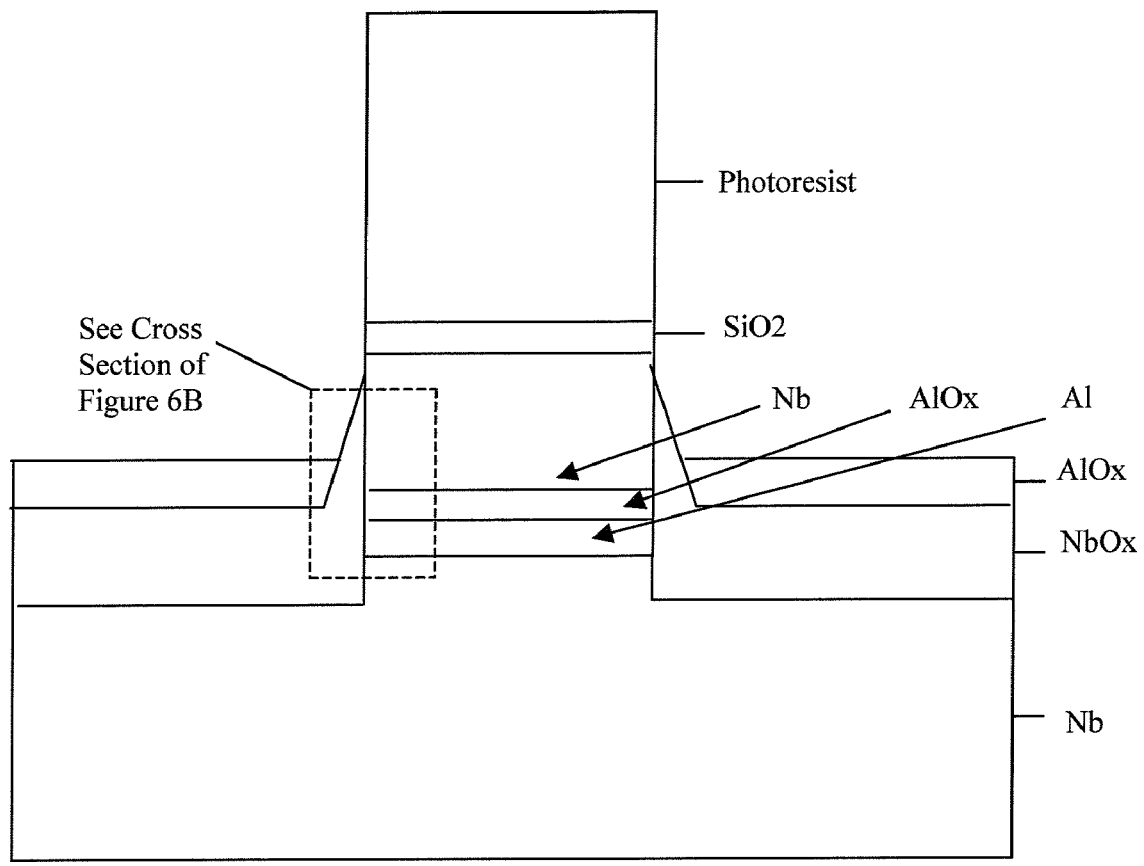
FIG. 6A shows the results of a selective anodization step whereby all the exposed Al and part of the underlying Nb are converted to insulating oxides.
Figure 6B:
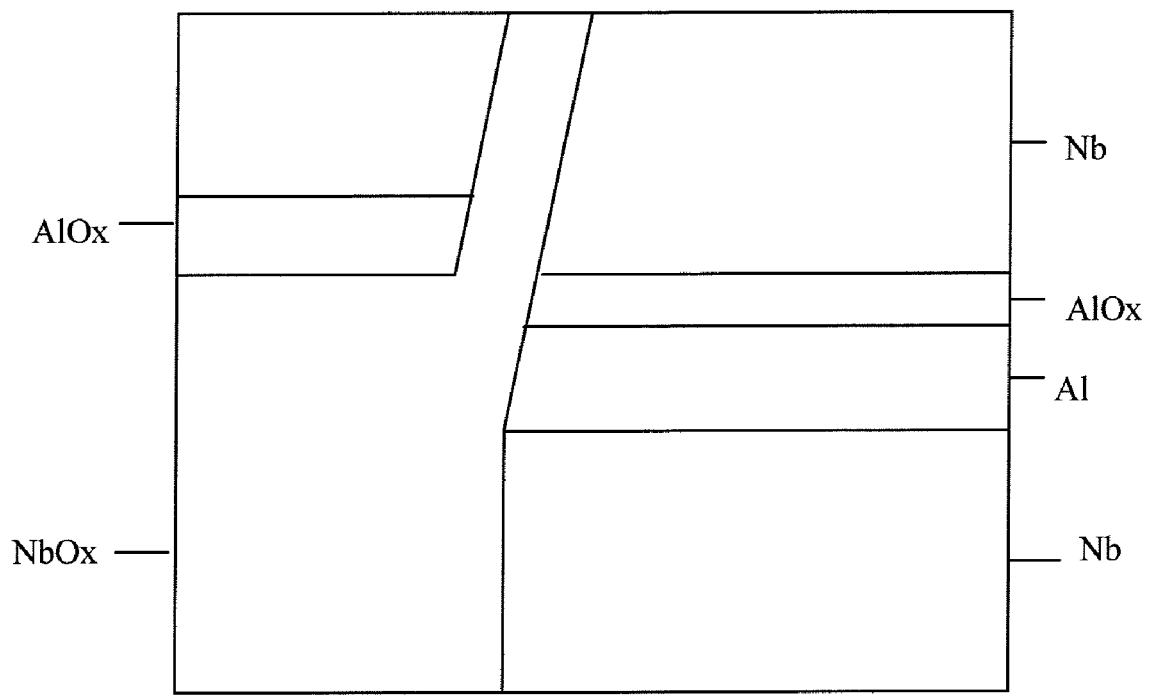
FIG. 6B shows a magnified view of the region inside the small dashed box in FIG. 6A.

4. After etching and without removing the resist, the wafer is immersed in an anodization solution, and all the surfaces that are not protected by the resist mask formed in step 5 are anodized. That is, the same resist etch mask is also used as an anodization mask. Anodization creates a bilayer of anodized Al (AlO$_x$) and anodized Nb (NbO$_x$) on the surface of the base electrode (FIG. 6). A layer of anodized Nb is also formed on all sidewalls of the junction's counter-electrode. This anodization step is very important because it encapsulates the junction's tunnel barrier with an anodized NbO$_x$ layer, and this, protects it from reacting with water, oxygen, and other processing chemicals during all further wafer processing steps. This step also allows for opening a contact hole to the counter-electrode that is larger in size than the junction itself. The thickness of the anodized layer is controlled by the anodization voltage, usually in the range of 15-50 V. The initial anodization current density is in the range from 0.5-5 mA/cm$^2$.

Figure 7:
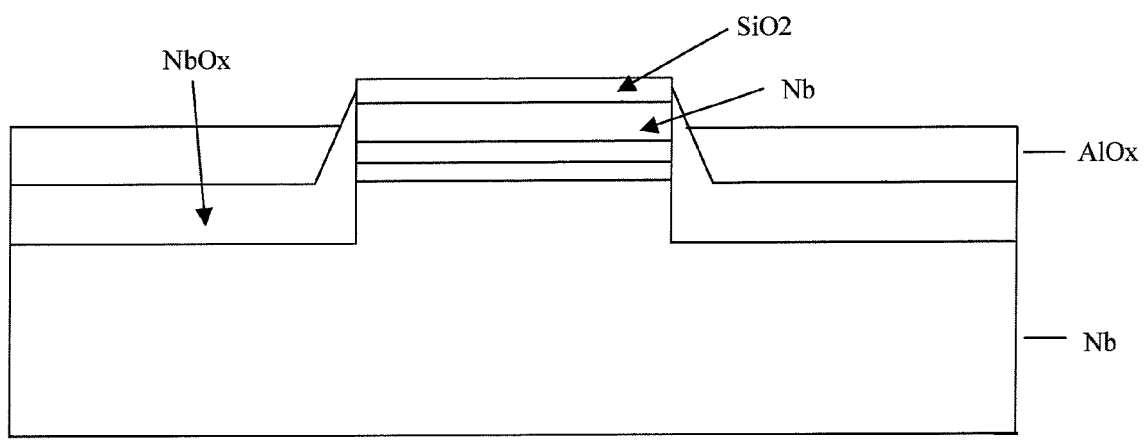
FIG. 7 shows the removal of the photoresist layer.

5. After anodization, the resist is stripped (FIG. 7), and the wafer proceeds to the next fabrication steps that are intended to pattern the base electrode of the junction by lithography and etching. This may also require removing the anodization layer in some parts of the circuit. It remains around the junction (the anodization ring of FIGS. 8-10).

6. After base electrode patterning, the Josephson junction is completely formed. All other fabrication steps are necessary in order to interconnect junctions in the circuits (such as the SiO$_2$ insulating layer in FIGS. 11-14), and to create resistors for biasing and shunting the junctions. These steps may vary depending on the details the fabrication process.

Figure 14:
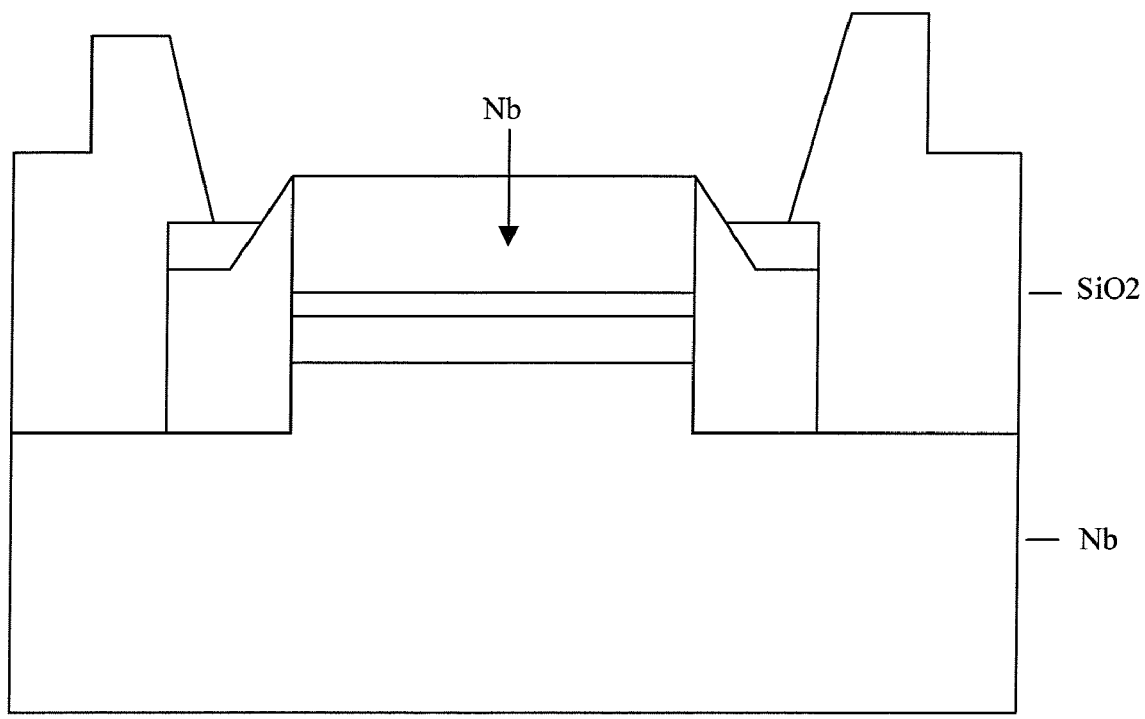
FIG. 14 shows the removal of the photoresist. Now the structure is ready for deposition of Nb wiring layer.
Figure 15:
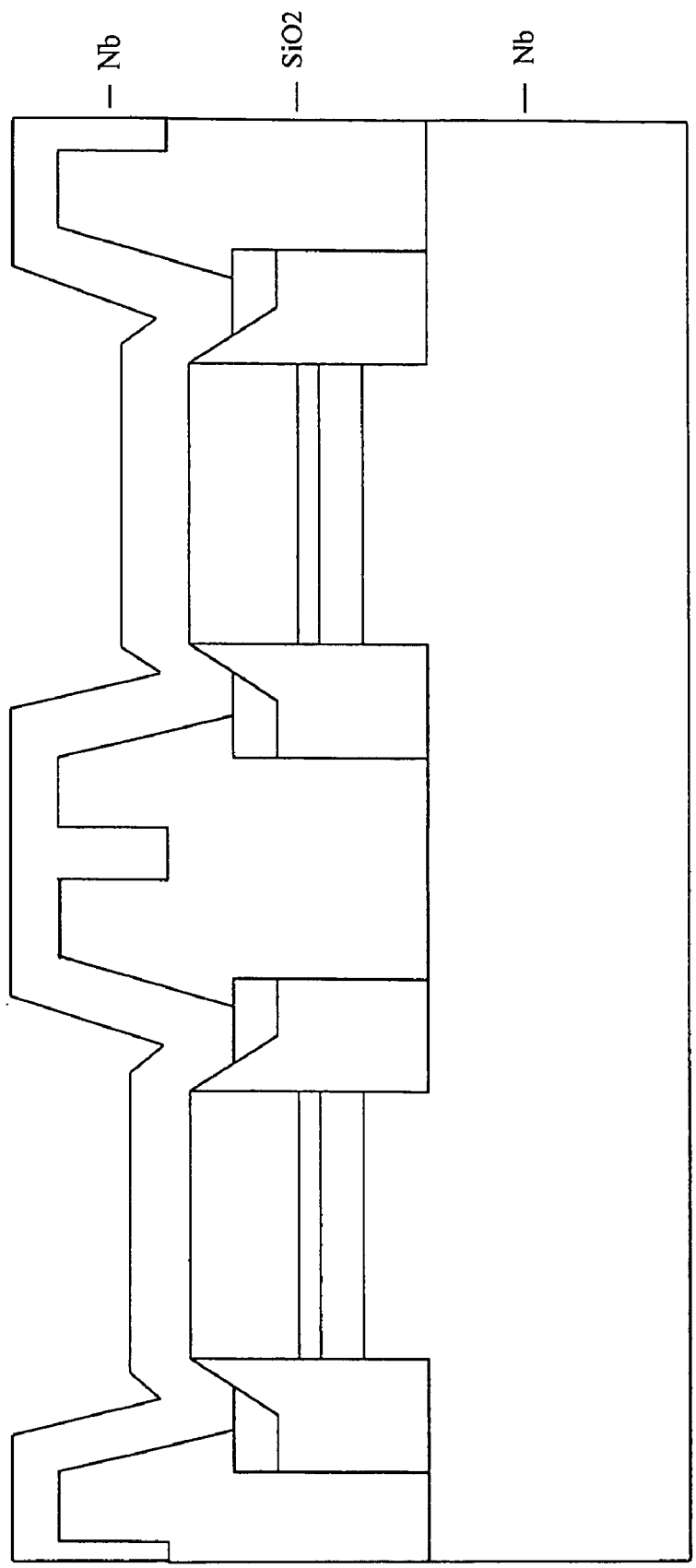
FIG. 15 shows two separately operating Josephson junctions, connected by a deposited Nb layer.

FIG. 15 shows two Josephson Junctions, each fabricated as shown in FIG. 14, connected by an Nb layer deposited over the Nb counter-electrode, SiO$_2$, and AlO$_x$.

One of the main sources of defects and loss of yield in this fabrication scheme is poor adhesion of the resist mask in step 3. Although this fact has not been recognized in the prior art. This may be due in part to the volume expansion of Nb and Al layers during anodization, which places significant local stresses on the photoresist mask. As a result, some parts of the resist mask may peel off during anodization, or anodization solutions may leach under the resist mask. This is especially a problem with many negative resists such as UVN-30. Some photoresists may also be incompatible with (partially soluable in) the common anodization solutions. In these cases, some junctions may be degraded, or the counter-electrode of some junctions may be partially anodized, thus preventing a good (superconducting) electrical contact to be made to the junctions during the following fabrication steps.

One improvement of the invention is to use a double-layer anodization mask with the lower layer being an inorganic dielectric layer (such as $SiO_2$) that is insoluble in water, solvents, and components of the anodization solution, and the upper layer is the photoresist (or e-beam resist) layer. $SiO_2$ is especially suitable since it has already been optimized as an insulating layer in the prior-art Nb integrated circuit process, and is also fully compatible with standard Si-based resist processing. This double-layer mask is formed in the following simple way:

a. After the Josephson junction trilayer (Nb/Al/$AlO_x$/Nb) is formed as in step 1 above, a pinhole-free layer of $SiO_2$ is deposited by any appropriate method (e.g., rf magnetron sputtering, or plasma-enhanced chemical vapor deposition—PECVD) on top of the trilayer (see FIG. 2). The layer thickness may be anywhere from 5 to 300 nm, and is not critical, as long as it is free from pinholes. Thicker layers require long etch times, making them impractical.

b. A resist mask is formed in the same way as in step 4 above.

c. Then etching is done, using reactive ion etching (RIE) or inductively coupled plasma (ICP) with fluorine-based chemistry (e.g., $SF_6$, $NF_3$, or $CF_4+O_2$) such that both the $SiO_2$ overlayer and the Nb counter-electrode are etched in the same process. This may be a one-step process when the same etch parameters are used for both layers, or a two-step process when different etch recipes are used for etching first the $SiO_2$ and then the Nb counter-electrode. After completing the etch down to the $AlO_x$/Al layer in the trilayer structure (FIG. 5), the top of the Josephson junction will have a double-layer structure ($SiO_2$+resist) that serves as the double-layer anodization mask.

d. Etching is immediately followed by the anodization step 3, without removing the resist mask (FIG. 6). Now there is a layer of $SiO_2$ under the resist mask for extra protection.

The advantages of the proposed method are as follows. The $SiO_2$ layer improves the adhesion of the resist, and does not allow the anodization solution to leach underneath. Since the adhesion of sputtered or PECVD-deposited $SiO_2$ to Nb has already been optimized, and is stronger than the adhesion of the resist to Nb, the double-layer also protects the junction counter-electrode from being anodized even in the unlikely event that a part of the resist mask pops off, or if the anodization solution does leach under the resist. In the rare case that the $SiO_2$ layer has a pinhole or other defect, the presence of the resist on top still provides protection during the anodization. The probability that both layers of the double-layer anodization mask fail in the same location is much smaller than the probability of a failure of a single-layer resist mask. As a result, a dramatic increase in the yield and junction quality is achieved.

Figure 8:
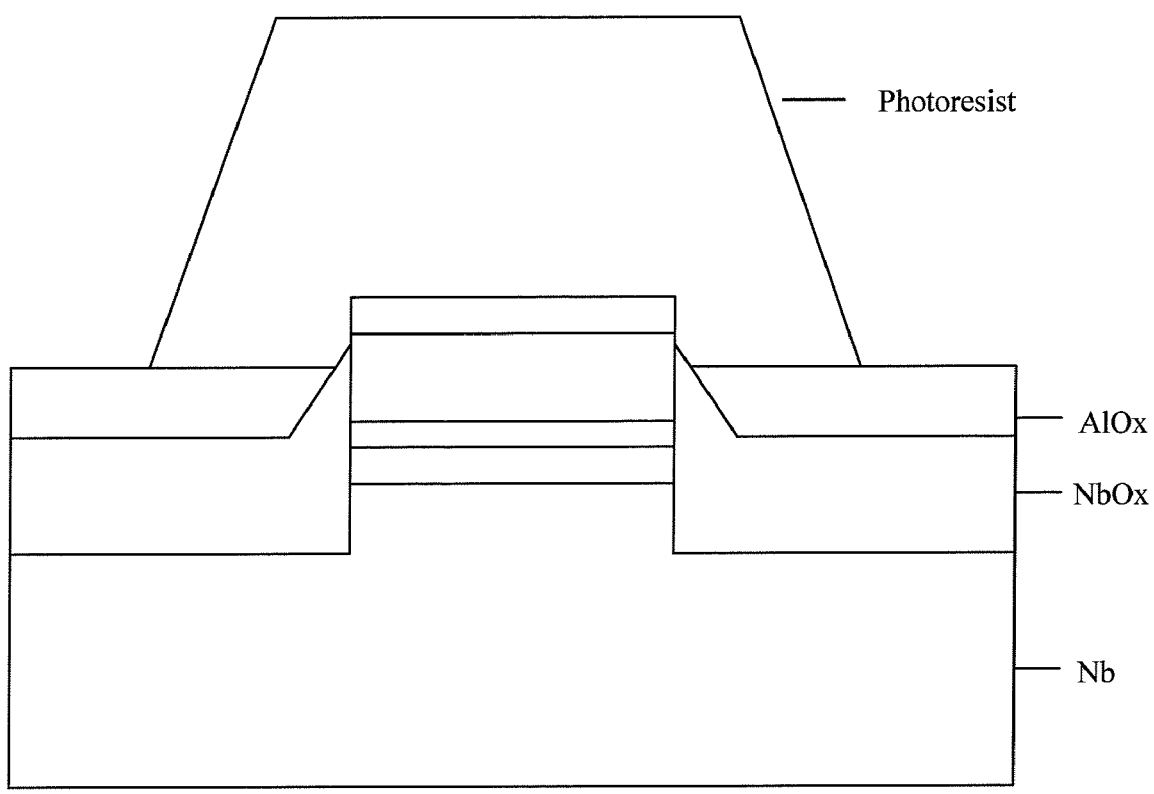
FIG. 8 shows the result of coating and patterning of another photoresist layer designed to produce a protective anodization ring around the junction area.
Figure 9:
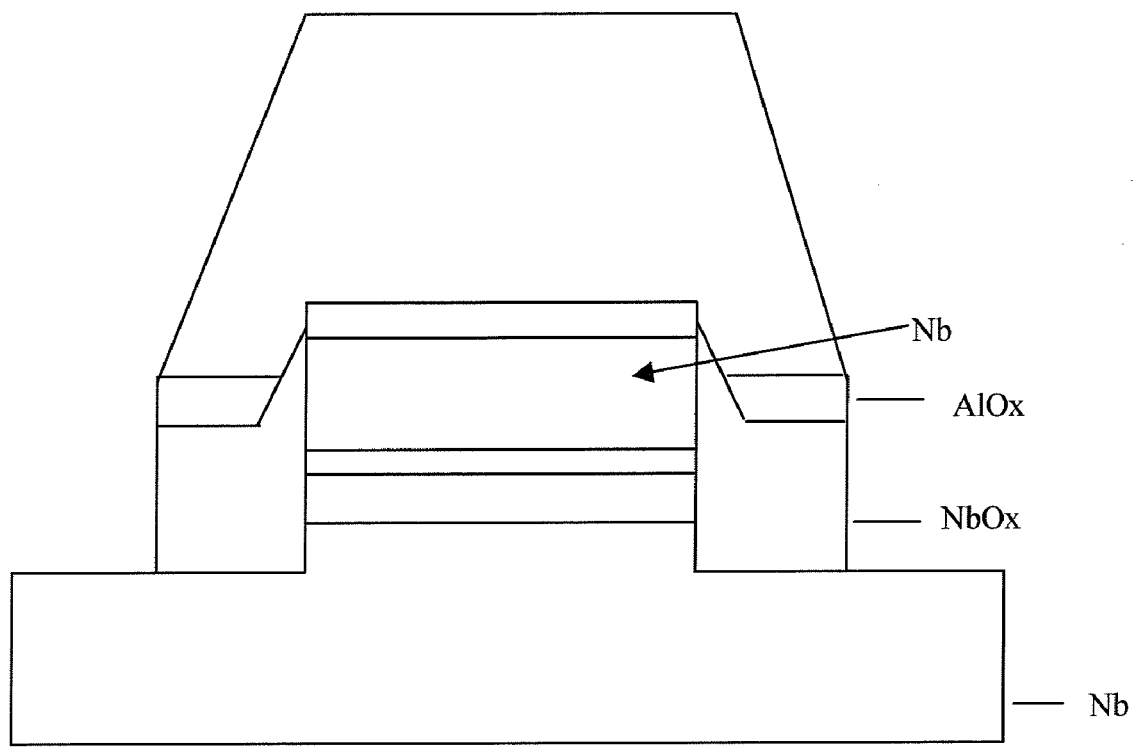
FIG. 9 shows the etching (by Ar ion milling or dry reactive ion etching) of the anodized oxide (both AlO$_x$ and NbO$_x$ layers) except in the anodization ring (under the photoresist mask)
Figure 10:
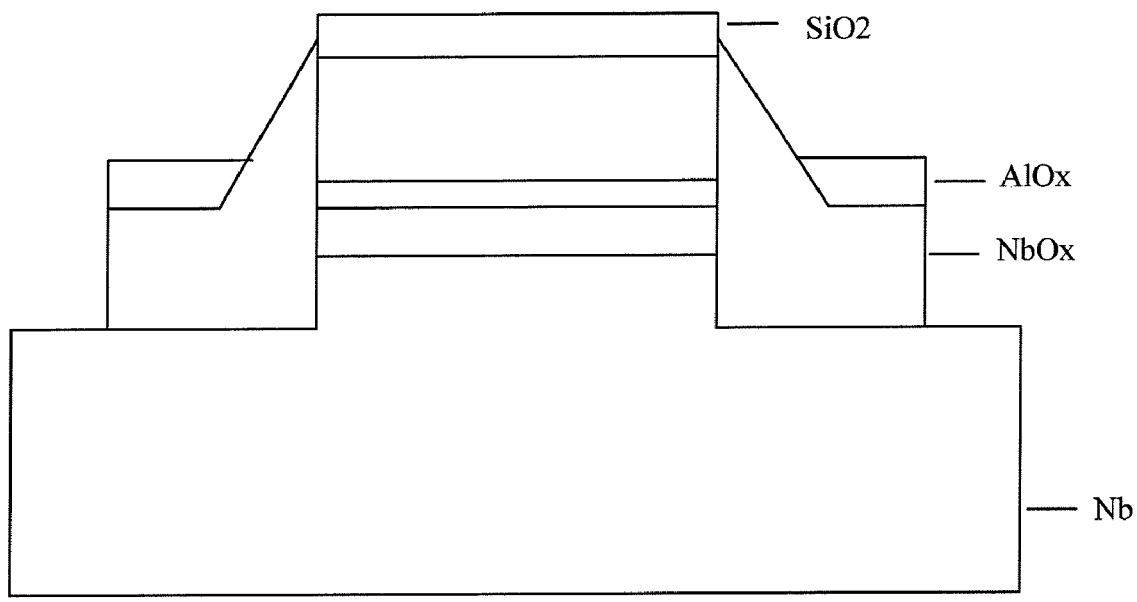
FIG. 10 shows the removal of the photoresist defining the anodization ring.
Figure 11:
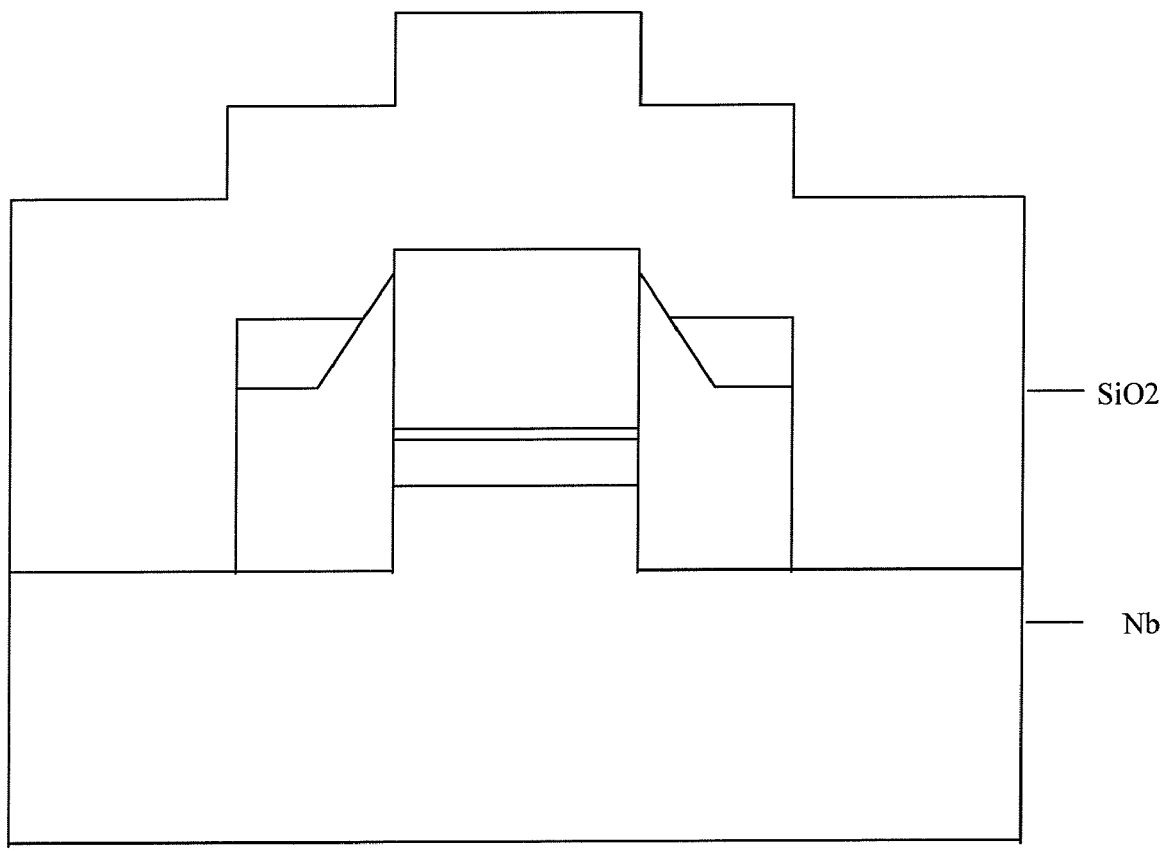
FIG. 11 shows the deposition of an SiO$_2$ insulating layer, designed to isolate the junction from subsequent wiring layers.
Figure 12:
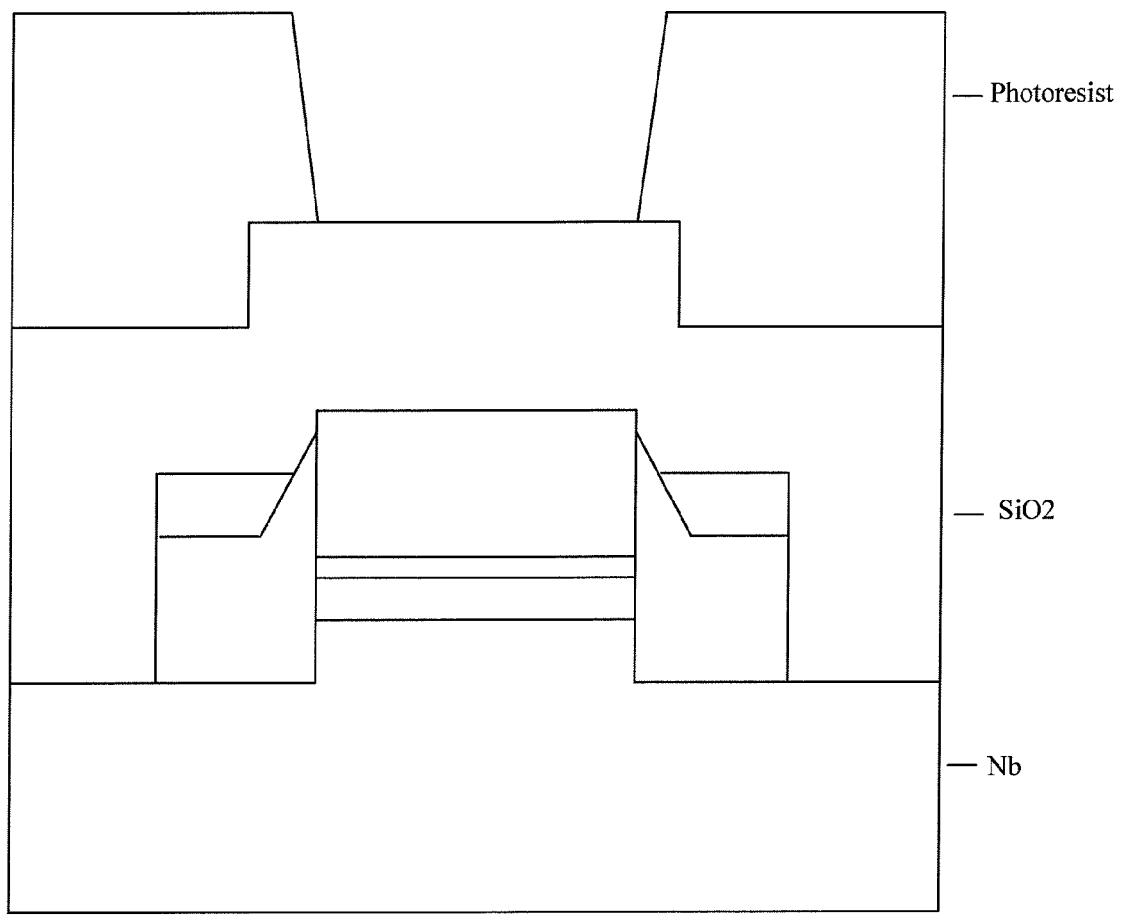
FIG. 12 shows the coating and patterning of a third photoresist layer, designed to produce a contact via to the Nb junction from a Nb wiring layer.
Figure 13:
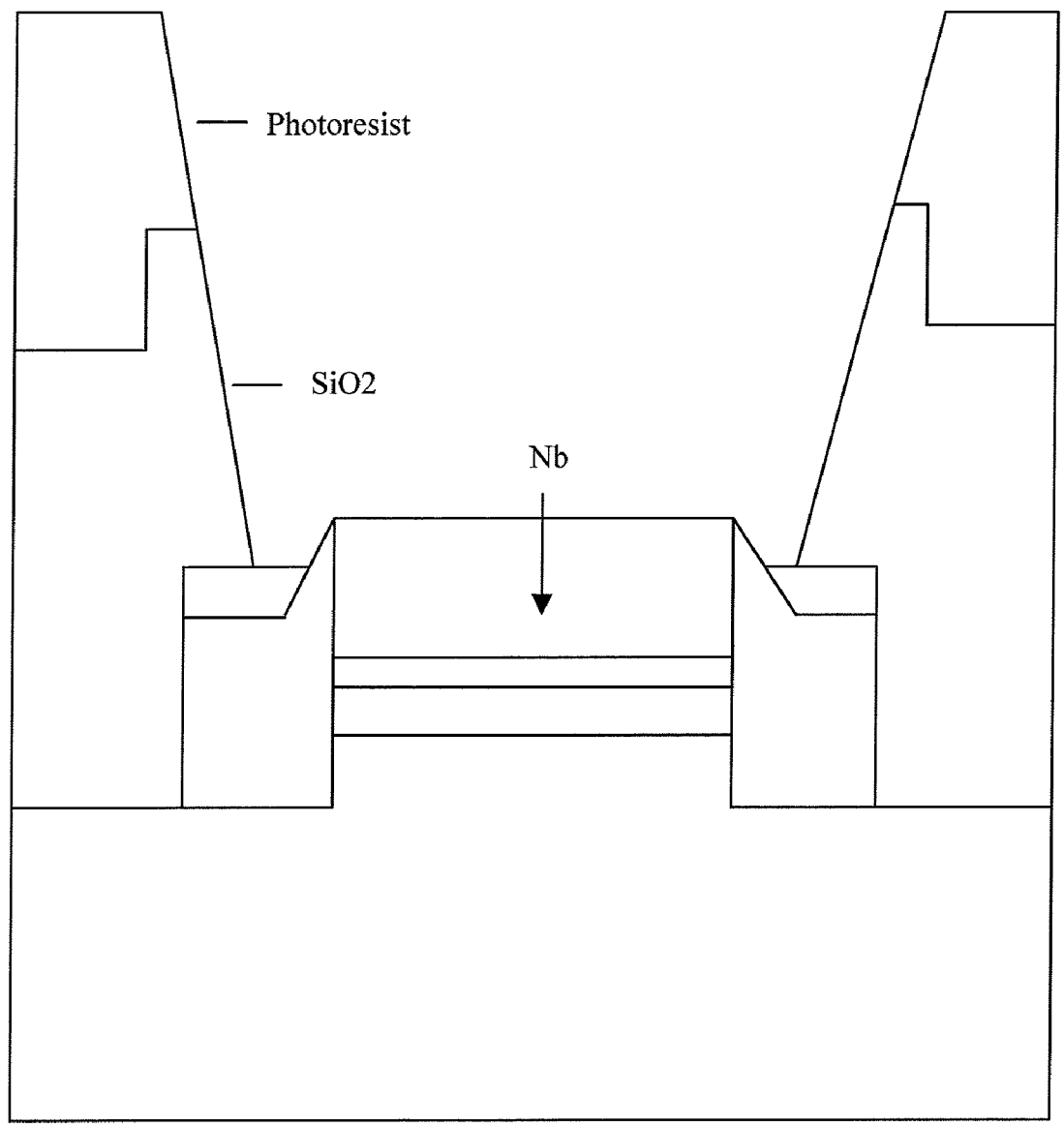
FIG. 13 shows the selective etching of the SiO$_2$ up to the Nb counter-electrode.

Another improvement over the prior art is described in reference to FIGS. 8 and 9, in defining the anodization ring around the Josephson junction. In the prior art, the $AlO_x$ layer was first removed by a wet etch process, followed by reactive ion etching (RIE) for removing the $NbO_x$ layer. However, a wet etch process can cause problems, that should preferably be avoided in high-reliability VLSI processing, particularly if sub-micron resolution is required. In the process of the present invention, this wet etch step is discarded, and two new approaches have been successfully demonstrated. In approach A, ion-milling with a neutral beam of argon (Ar) atoms is used to remove both the $AlO_x$ and the $NbO_x$ layers. In approach B, plasma etching (RIE or ICP) is used in a two-step process. First, a chlorine-based plasma is used to remove $AlO_x$, and then a fluorine-based plasma is used to remove the $NbO_x$. Either approach provides for increased yield and uniformity.

While various embodiments of the present invention have been illustrated herein in detail, it should be apparent that modifications and adaptations to those embodiments may occur to those skilled in the art without departing from the scope of the present invention as set forth in the following claims.

The invention claimed is:

1. A method for fabrication of an integrated circuit having Josephson junctions, comprising the steps of:
   (a) depositing a Josephson junction trilayer on a substrate;
   (b) depositing at least one strongly adhering adhesion layer comprising $SiO_2$ on an unpatterned Josephson junction trilayer;
   (c) depositing a resist on top of the at least one adhesion layer;
   (d) exposing the resist to radiation to define a latent pattern therein;
   (e) selectively removing a first portion of the resist in dependence on the defined latent pattern, a second portion of the resist remaining on the at least one adhesion layer having a strong adhesion thereto;
   (f) etching a portion of the at least one adhesion layer exposed by removal of the first portion of the resist to form a bilayer mask which selectively exposes portions of the Josephson junction trilayer surrounded by the bilayer mask which masks other portions of the Josephson junction trilayer; and
   (g) processing exposed portions of the Josephson junction trilayer through the bilayer mask to selectively form circuit elements therefrom.

2. The method according to claim 1, wherein the circuit elements have minimum feature sizes less than 1.5 microns.

3. The method according to claim 1, wherein the circuit elements have submicron feature sizes.

4. The method according to claim 1, wherein the Josephson junction trilayer comprises a niobium-based superconductor.

5. The method according to claim 1, wherein the resist comprises a photoresist.

6. The method according to claim 1, wherein the resist comprises an electron beam exposed resist.

7. The method according to claim 1, wherein the etching comprises plasma etching.

8. The method according to claim 1, wherein the etching comprises reactive ion etching.

9. The method according to claim 1, wherein the etching comprises ion beam etching.

10. The method according to claim 1, wherein the at least one adhesion layer is deposited substantially without formation of pin holes therethrough.

11. The method according to claim 1, wherein the at least one adhesion layer is deposited by a sputtering process.

12. The method according to claim 1, wherein said processing comprises anodization.

13. The method according to claim 1, wherein said processing step processes substantially absent a wet etching process.

14. The method according to claim 13, wherein processing step comprises an anodization step adapted to convert the exposed portion of the Josephson junction trilayer to an $AlO_x$ layer over a $NbO_x$ layer, followed by ion-milling with a neutral beam of argon atoms to remove the $AlO_x$ layer and the $NbO_x$ layer.

15. The method according to claim 13, wherein processing step comprises an anodization step adapted to convert at least a portion of the Josephson junction trilayer to an $AlO_x$ layer over a $NbO_x$ layer, followed by a chlorine-based plasma etching to remove the $AlO_x$ layer, and a fluorine-based plasma etching to remove the $NbO_x$ layer.

16. The method according to claim 1, wherein the circuit elements comprise at least two separately operating Josephson junctions.

17. An intergrated circuit produced by the method according to claim 1.

18. A method for fabrication of an integrated circuit having Josephson junctions, comprising the steps of:
(a) providing a substrate, having a Josephson junction trilayer thereon, covered by an intermediate layer comprising $SiO_2$, and a resist layer;
(b) selectively removing portions of the resist in dependence on an irradiation pattern, to expose portions of the intermediate layer;
(c) etching the exposed portions of the intermediate layer to expose portions of the Josephson junction trilayer, to thereby form a bilayer mask in which the resist is strongly adherent to the intermediate layer during at least an anodization process; and
(d) anodizing the exposed portions of the Josephson junction trilayer through the bilayer mask to selectively form circuit elements therefrom.

19. A method for fabrication of an integrated circuit having Josephson junctions, comprising the steps of:
(a) providing a substrate, having a Josephson junction trilayer thereon, selectively covered by a bilayer mask pattern comprising an $SiO_2$-containing intermediate layer, and a top resist layer strongly adherent to the $SiO_2$-containing intermediate layer, which selectively exposes portions of the Josephson junction trilayer;
(b) processing the exposed portions of the Josephson junction trilayer through the bilayer mask pattern to modify the exposed portions of the Josephson junction trilayer, while retaining portions of the Josephson junction which are not exposed through the bilayer mask pattern, substantially without removing the bilayer mask pattern before or during said processing.

* * * * *